(12) United States Patent
Kawamura

(10) Patent No.: US 9,287,667 B2
(45) Date of Patent: Mar. 15, 2016

(54) SHIELD SHELL AND SHIELD CONNECTOR

(75) Inventor: Masayuki Kawamura, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 38 days.

(21) Appl. No.: 14/351,762

(22) PCT Filed: Mar. 1, 2012

(86) PCT No.: PCT/JP2012/055177
§ 371 (c)(1),
(2), (4) Date: Aug. 14, 2014

(87) PCT Pub. No.: WO2013/054552
PCT Pub. Date: Apr. 18, 2013

(65) Prior Publication Data
US 2014/0367157 A1   Dec. 18, 2014

(30) Foreign Application Priority Data

Oct. 12, 2011 (JP) ................................ 2011-225017

(51) Int. Cl.
*H01R 13/648* (2006.01)
*H01R 13/6593* (2011.01)
*H05K 9/00* (2006.01)
(52) U.S. Cl.
CPC .......... *H01R 13/648* (2013.01); *H01R 13/6593* (2013.01); *H05K 9/0007* (2013.01)
(58) Field of Classification Search
CPC .................................................. H01R 13/6593
USPC ........................................................ 174/359
See application file for complete search history.

(56) References Cited

U.S. PATENT DOCUMENTS

| 5,419,721 | A | 5/1995 | Lignelet |
| 5,437,564 | A | 8/1995 | Lignelet |
| 7,731,543 | B2 | 6/2010 | Aoki et al. |
| 7,934,950 | B2 | 5/2011 | Yong |
| 7,959,468 | B2 | 6/2011 | Yong et al. |
| 2010/0178805 | A1* | 7/2010 | Yong et al. ............... 439/607.41 |

FOREIGN PATENT DOCUMENTS

| JP | 07-099073 | 4/1995 |
| JP | 07-099074 | 4/1995 |
| JP | 2008-235190 | 10/2008 |
| JP | 2008-262811 | 10/2008 |
| JP | 2009-87888 | 4/2009 |
| JP | 2010-113910 | 5/2010 |
| JP | 2010-165512 | 7/2010 |

OTHER PUBLICATIONS

International Search Report of May 22, 2012.

* cited by examiner

*Primary Examiner* — Hung V Ngo
(74) *Attorney, Agent, or Firm* — Gerald E. Hespos; Michael J. Porco; Matthew T. Hespos

(57) ABSTRACT

The present invention concerns a shield shell (70) to be connected to a case made of metal and including a shell main body (71) with a case connecting portion (74) to be connected to the case, a single collective shield connecting portion (72) provided on the shell main body (71) and formed into an elliptical tubular shape, and a plurality of individual-core shield connecting portions (77) provided on the shell main body (71) and formed into a cylindrical shape. The present invention may also concern a shield connector (10) including the shield shell (70), a housing (40) to be held onto the shield shell (70), wires with terminal fittings (20) inserted through the interior of the housing (40), and a single braided wire (90) connected to the single collective shield connecting portion (72) of the shield shell (70).

5 Claims, 9 Drawing Sheets

SHIELD SHELL AND SHIELD CONNECTOR

BACKGROUND

1. Field of the Invention

The present invention relates to a shield shell and a shield connector.

2. Description of the Related Art

Conventionally, there are known two types of shield shells for shield connectors, i.e. a collective shield type disclosed in Japanese Unexamined Patent Publication No. 2010-113910 below and an individual-core shield type disclosed in Japanese Unexamined Patent Publication No. 2010-165512 below. A shield shell of the collective shield type is for collectively shielding a plurality of wires by covering them by one braided wire, and a shield shell of the individual-core shield type is for shielding a plurality of wires by individually covering each of the wires by a braided wire.

The reason why two types of shield shells are provided as described above is that there are two types of shield connecting portions of devices to be connected to shield shells via braided wires, i.e. a collective shield type and an individual-core shield type. Specifically, a shield shell of a shield connector needs to be of the collective shield type if a shield connecting portion of a device is of the collective shield type, and a shield shell of a shield connector needs to be of the individual-core shield type if a shield connecting portion of a device is of the individual-core shield type. Thus, it has been necessary to prepare two types of shield shells so as to be able to deal with both connection methods.

The present invention was completed based on the above situation and aims to provide a common shield shell capable of dealing with both a collective shield type and an individual-core shield type.

SUMMARY OF THE INVENTION

The present invention is directed to a shield shell to be connected to a case made of metal, including a shell main body including a case connecting portion to be connected to the case; a single collective shield connecting portion provided on the shell main body and formed into a tubular shape; and a plurality of individual-core shield connecting portions provided on the shell main body and formed into a tubular shape.

The present invention may also be directed to a shield connector, including the above shield shell; a housing to be held onto the shield shell; wires with terminal fittings inserted through the interior of the housing; and a single shielding member connected to the single collective shield connecting portion of the shield shell.

The present invention may further be directed to a shield connector, including the above shield shell; a housing to be held onto the shield shell; wires with terminal fittings inserted through the interior of the housing; and a plurality of shielding members respectively connected to the plurality of individual-core shield connecting portions of the shield shell.

According to these configurations, both a collective shield type and an individual-core shield type can be dealt with since both the collective shield connecting portion and the individual-core shield connecting portions are provided.

The following configurations are preferable as embodiments of the present invention.

A plurality of wires may be pulled out from the plurality of individual-core shield connecting portions to the outside of the shell main body.

According to such a configuration, the individual-core shield connecting portions can be used as draw-out openings for the wires.

The collective shield connecting portion may be formed to project backward from a front wall portion continuous with the case connecting portion on the shell main body.

According to such a configuration, the shell main body and the collective shield connecting portion can be formed by drawing a metal plate material.

The plurality of individual-core shield connecting portions may be provided on a rear wall portion arranged at a side of the shell main body opposite to the front wall portion.

According to such a configuration, the shell main body, the collective shield connecting portion and the plurality of individual-core shield connecting portions can be formed by drawing a metal plate material.

Any of the collective shield connecting portion and the plurality of individual-core shield connecting portions may be caulked together with a shielding member by a caulking ring.

According to such a configuration, the shielding member(s) can be connected to the collective shield connecting portion or the plurality of individual-core shield connecting portions by the caulking ring(s).

Effect of the Invention

According to the present invention, it is possible to provide a common shield shell capable of dealing with both a collective shield type and an individual-core shield type.

DETAILED DESCRIPTION OF THE PREFERRED EMBODIMENTS

Figure 1:
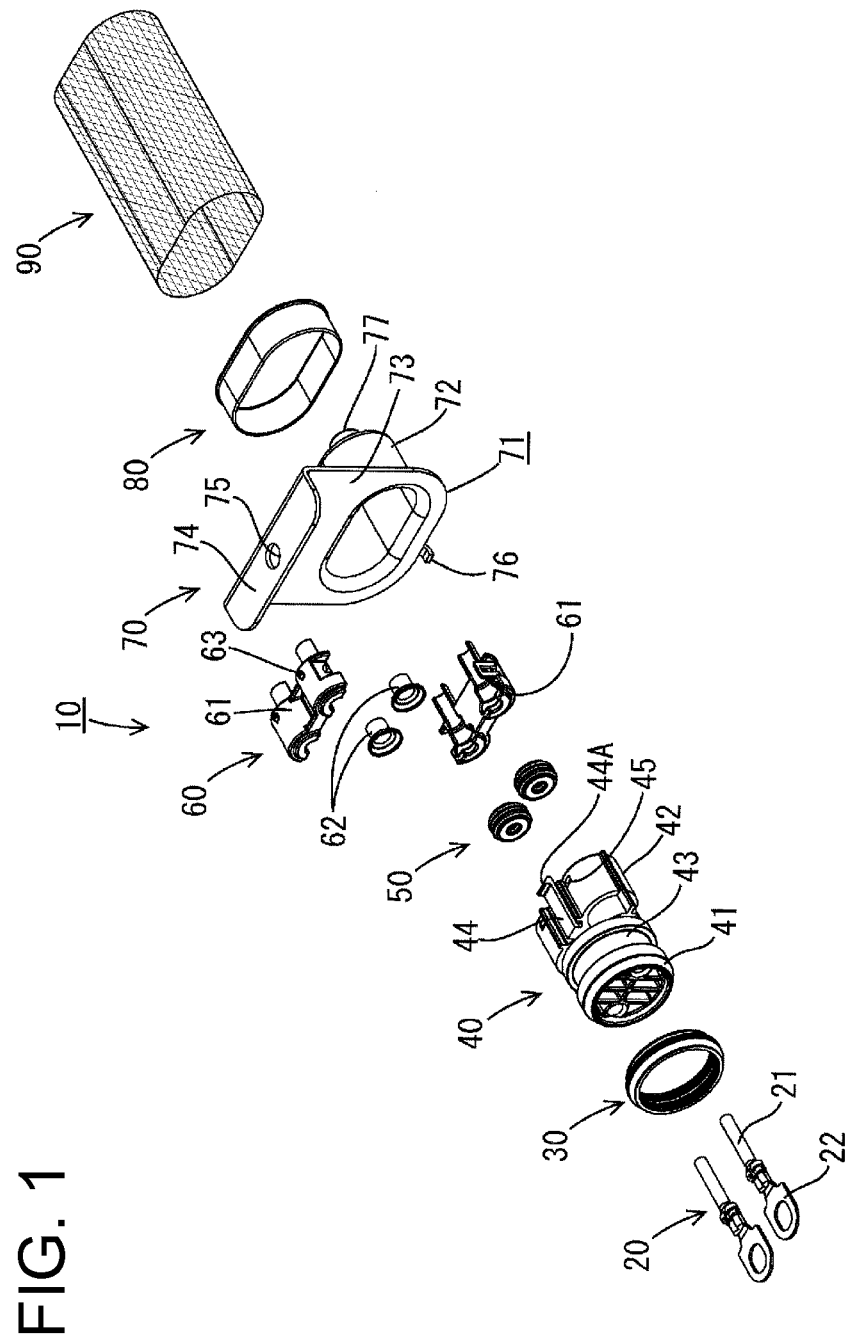
FIG. 1 is an exploded perspective view of a shield connector of a collective shield type in an embodiment.
Figure 2:
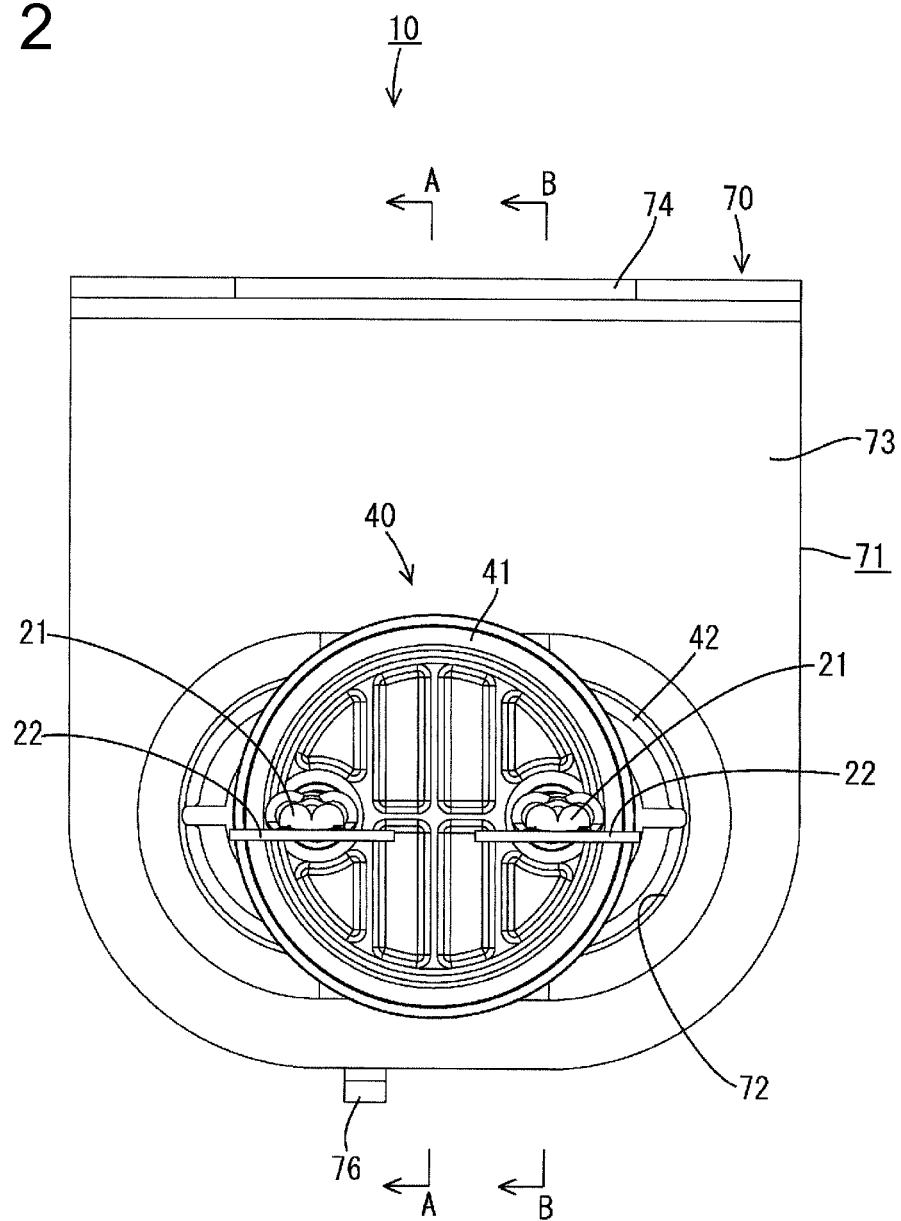
FIG. 2 is a front view of the shield connector of the collective shield type.

An embodiment of the present invention is described with reference to FIGS. 1 to 9. A shield connector 10 of this embodiment includes, as shown in FIG. 1, wires with terminal fittings 20, a rubber ring 30, a housing 40, rubber plugs 50, a wire holder 60, a shield shell 70, a caulking ring 80, a braided wire 90 and the like. This shield connector 10 is fittable into a mounting hole provided on a case (not shown) made of metal and shield-connected by fixing the shield shell 70 to the case by a bolt. Note that, in the following description, a side to be fitted into the mounting hole is referred to as a front side concerning a front-back direction.

The wire with the terminal fitting 20 is formed by crimping and connecting a terminal fitting 22 to a core exposed at an end of a wire 21. The wire 21 is such that the core is covered by an insulation coating. On the other hand, the terminal fitting 22 is a so-called round terminal and connected to a terminal block provided in the case by bolting.

The housing 40 is made of synthetic resin and includes a fitting portion 41 fittable into the mounting hole of the case and a wire holder accommodating portion 42 arranged behind this fitting portion 41. The fitting portion 41 has a circular outer peripheral shape, and a mounting groove 43, into which the rubber ring 30 is to be mounted, is circumferentially provided on the outer peripheral surface thereof. Further, a pair of retaining pieces 44, 44 are provided on opposite upper and lower surfaces of the wire holder accommodating portion 42. These retaining pieces 44 are cantilevered backward and vertically resiliently deformable.

The wire holder 60 is formed by assembling a pair of upper and lower half bodies 61, 61. A pair of caulking members 62, 62 are held in a retained state between the both half bodies 61, 61. Each caulking member 62 has a hollow cylindrical shape and the wire 21 is inserted thereinto. When the caulking member 62 is caulked with the wire 21 inserted in the caulking member 62, the caulking member 62 is integrally held to the wire 21. By sandwiching each caulking member 62 holding the wire 21 by the pair of half bodies 61, 61, each wire 21 is held in the wire holder 60.

A plurality of retaining projections 63 are provided on the outer periphery of the wire holder 60. Two retaining projections 63 are arranged on an upper side of the wire holder 60 while being spaced apart in a width direction, and two retaining projections 63 are arranged on a lower side of the wire holder 60 while being spaced apart in the width direction. The respective retaining projections 63 are arranged to be located at opposite upper and lower sides of the respective wires 21, 21. On the other hand, the wire holder accommodating portion 42 is provided with a plurality of retaining holes 45 into which the respective retaining projections 63 are fitted to be locked. When the wire holder 60 is accommodated into the wire holder accommodating portion 42, each retaining projection 63 is fitted into the corresponding retaining hole 45 to be locked, whereby the wire holder 60 is held in the wire holder accommodating portion 42.

Figure 4:
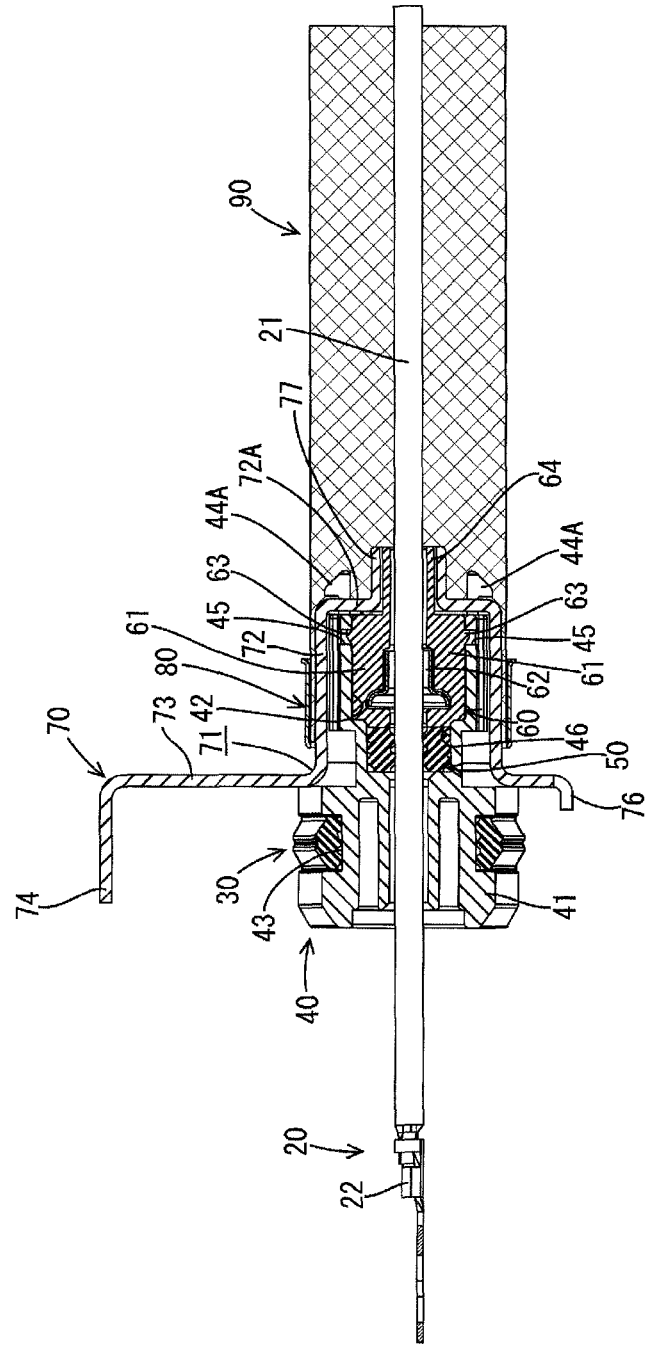
FIG. 4 is a section along B-B of FIG. 2.

Further, as shown in FIG. 4, the wire holder 60 also functions to retain the rubber plugs 50. Specifically, rubber plug accommodating portions 46, into which the rubber plugs 50 are to be accommodated, are formed between the back wall of the wire holder accommodating portion 42 and the front end of the wire holder 60. The rubber plug 50 in the rubber plug accommodating portion 46 is held in close contact with the outer peripheral surface of the wire 21 and the inner peripheral surface of the rubber plug accommodating portion 46. In this way, the interior of the housing 40 is waterproofed. Further, a pair of protection tubes 64, 64 through which the respective wires 21, 21 are inserted are provided in a rear end part of the wire holder 60. These protection tubes 64 prevent the wires 21 from being damaged due to contact with the rear end opening edges of individual-core shield connecting portions 77 of the shield shell 70 to be described later.

The shield shell 70 is formed by drawing an electrical conductive metal plate material and includes a shell main body 71 into which the wire holder accommodating portion 42 is to be accommodated. This shell main body 71 includes a single collective shield connecting portion 72 having a laterally long elliptical outer peripheral shape and formed into a tubular shape extending in the front-back direction as a whole. A flange portion 73 is circumferentially provided to bulge out radially outward from the front end opening edge of the collective shield connecting portion 72, and a case connecting portion 74 is connected to extend forward from the upper edge of this flange portion 73. The collective shield connecting portion 72 is formed to project backward from the flange portion 73. A fixing hole 75 is formed to vertically penetrate in a widthwise center of the case connecting portion 74. On the other hand, an error assembly preventing piece 76 is provided on the lower edge of the flange portion 73.

Figure 3:
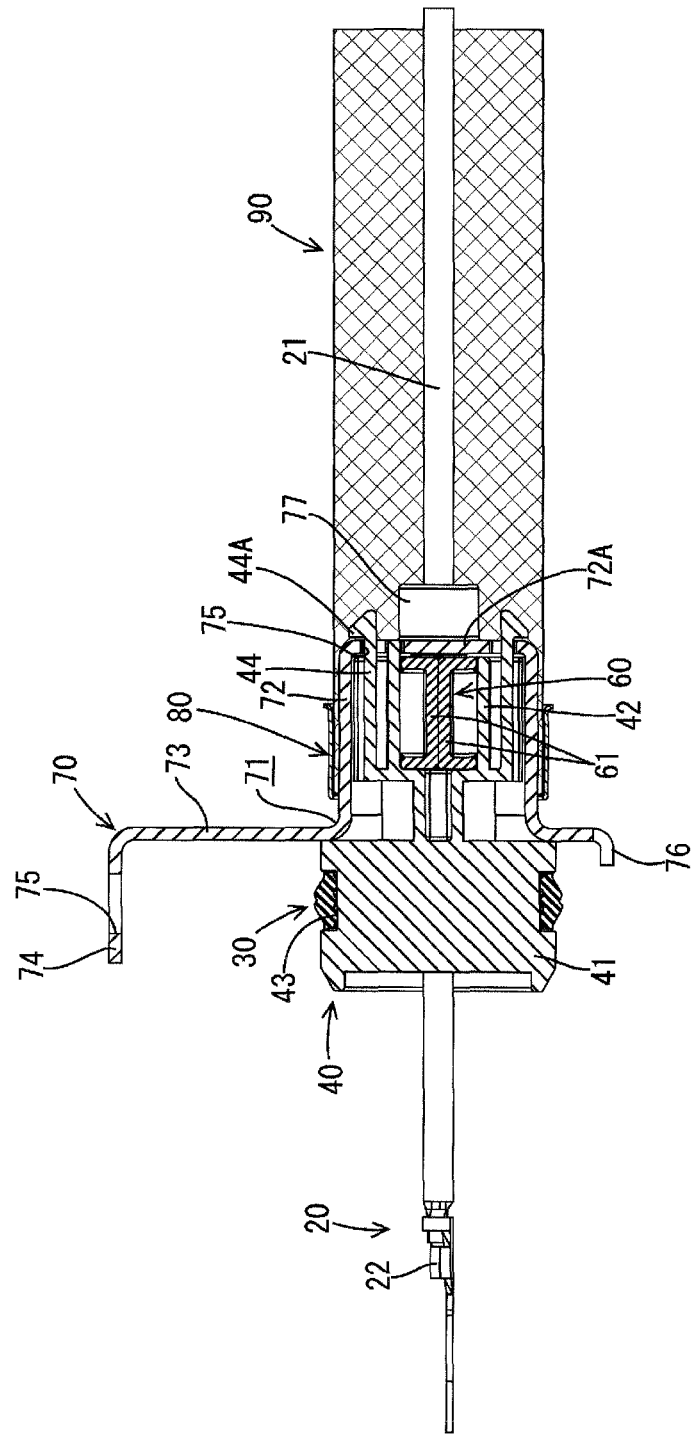
FIG. 3 is a section along A-A of FIG. 2.
Figure 7:
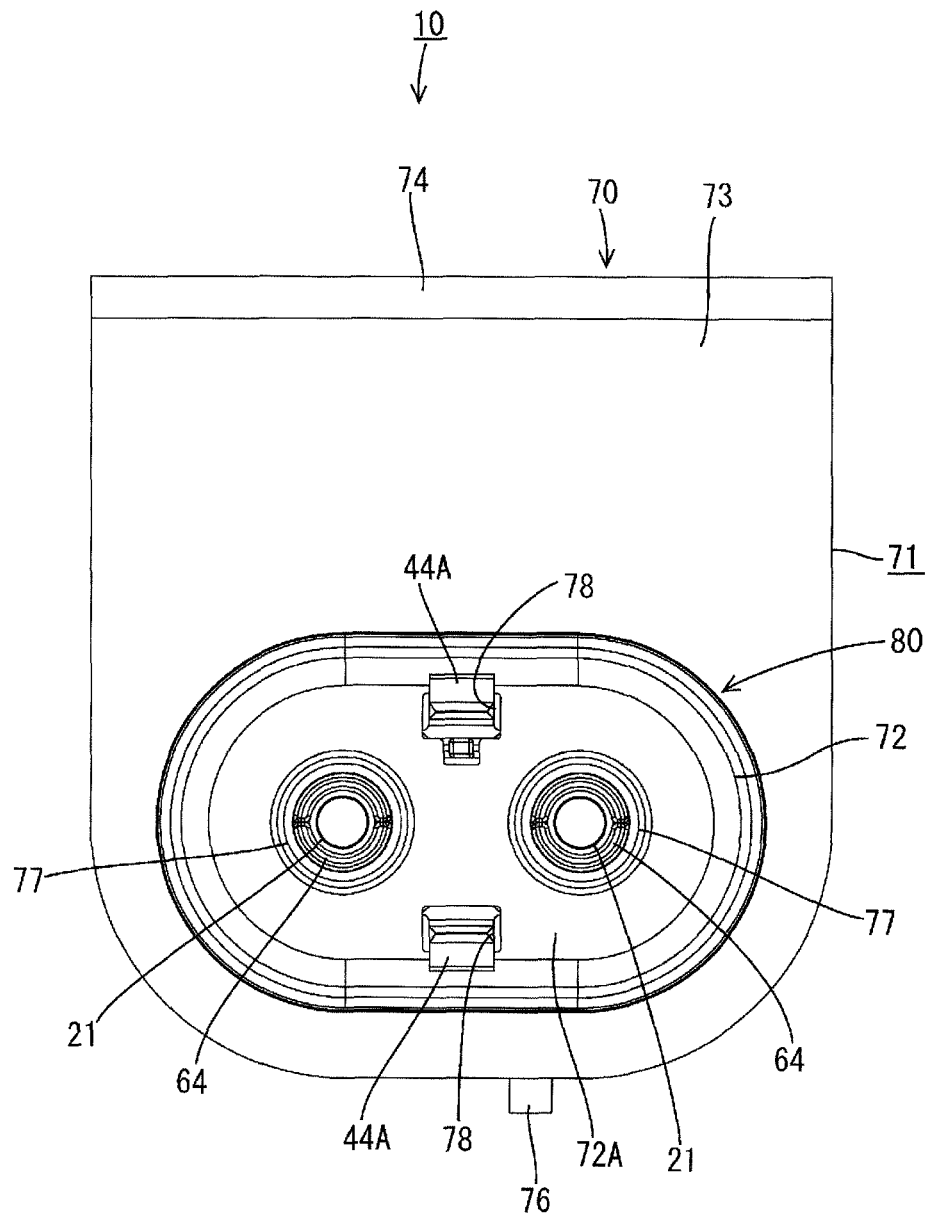
FIG. 7 is a rear view of the shield connector of the collective shield type.

The collective shield connecting portion 72 is substantially in the form of a receptacle whose front end is open forward and whose rear end is closed, and a pair of individual-core shield connecting portions 77, 77 are connected to a back wall 72A of the collective shield connecting portion 72. Each individual-core shield connecting portion 77 is formed into a hollow cylindrical shape penetrating in the front-back direction. An inner diameter of this individual-core shield connecting portion 77 is set to be larger than an outer diameter of the wire 21. Further, a pair of upper and lower locking holes 78, 78 are provided in the back wall 72A of the collective shield connecting portion 72 as shown in FIG. 7. As shown in FIG. 3, locking projections 44A provided on the tips of the retaining pieces 44 are fitted into these locking holes 78 to be locked. In this way, the housing 40 is held onto the shield shell 70.

Figure 5:
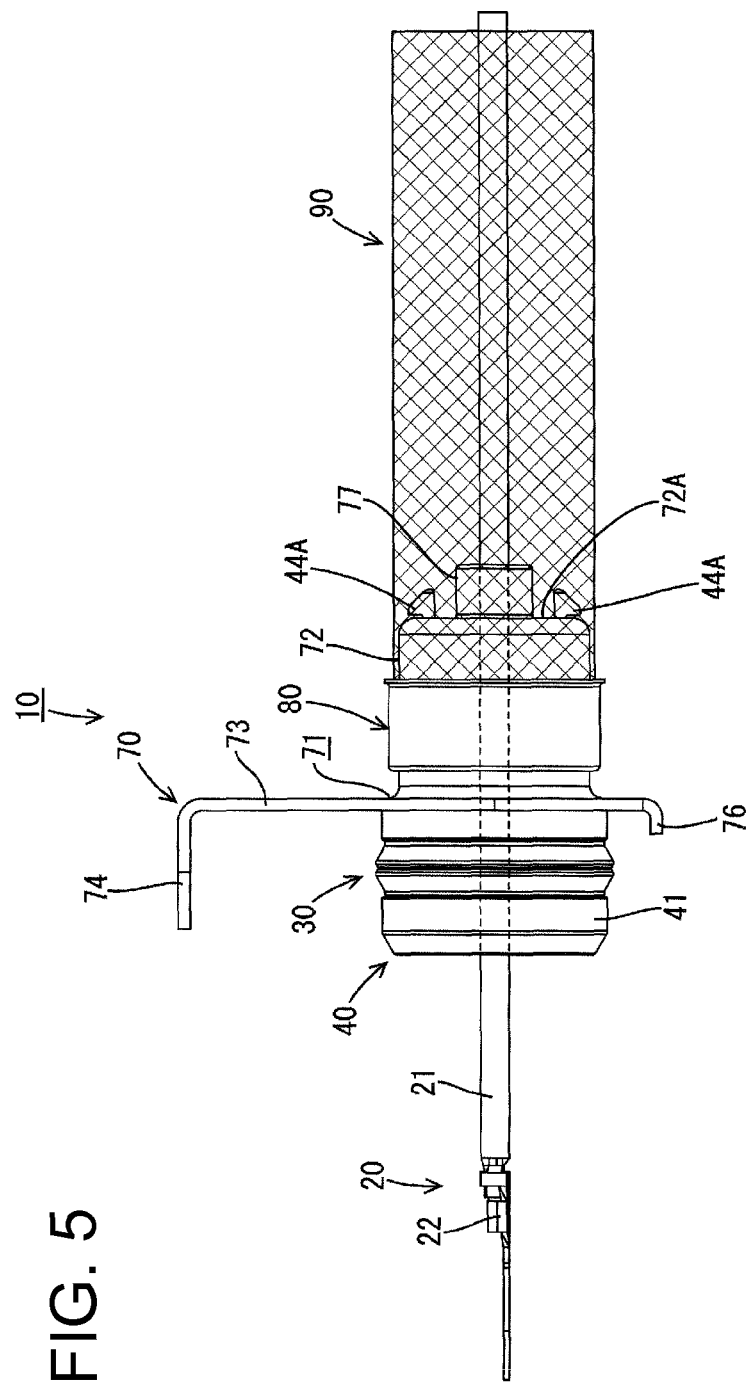
FIG. 5 is a right side view of the shield connector of the collective shield type.
Figure 6:
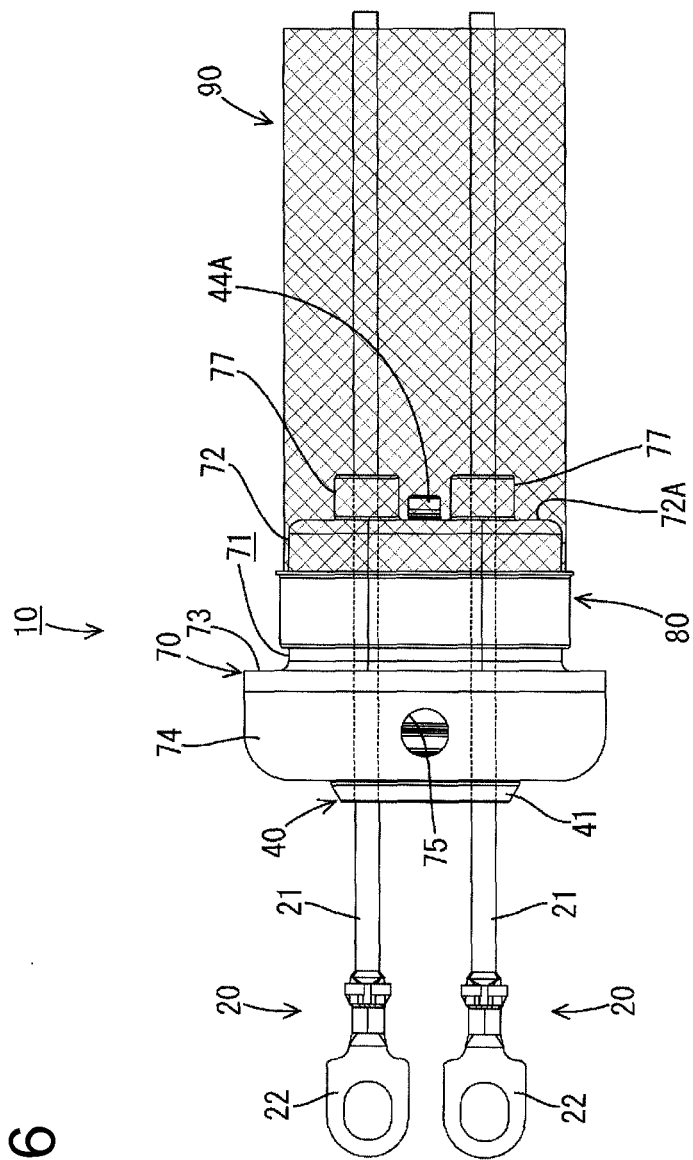
FIG. 6 is a plan view of the shield connector of the collective shield type.

The braided wire 90 is mounted on the outer periphery of the collective shield connecting portion 72 and the caulking ring 80 is caulked on the outer periphery of the braided wire 90, whereby the braided wire 90 is shield-connected to the outer peripheral surface of the collective shield connecting portion 72. In a state held in the wire holder 60 and mounted into the housing 40, the respective wires 21, 21 are arranged straight and in parallel as shown in FIGS. 5 and 6. Specifically, the wires 21, 21 are so arranged that an interval between the wires 21, 21 pulled out forward from the housing 40 and that between the wires 21, 21 pulled out backward from the shield shell 70 are equal. This means no need to provide a section, where the interval between the wires 21, 21 is adjusted, in the shield connector 10, and can shorten the shield connector 10 in the front-back direction by that much.

Figure 8:
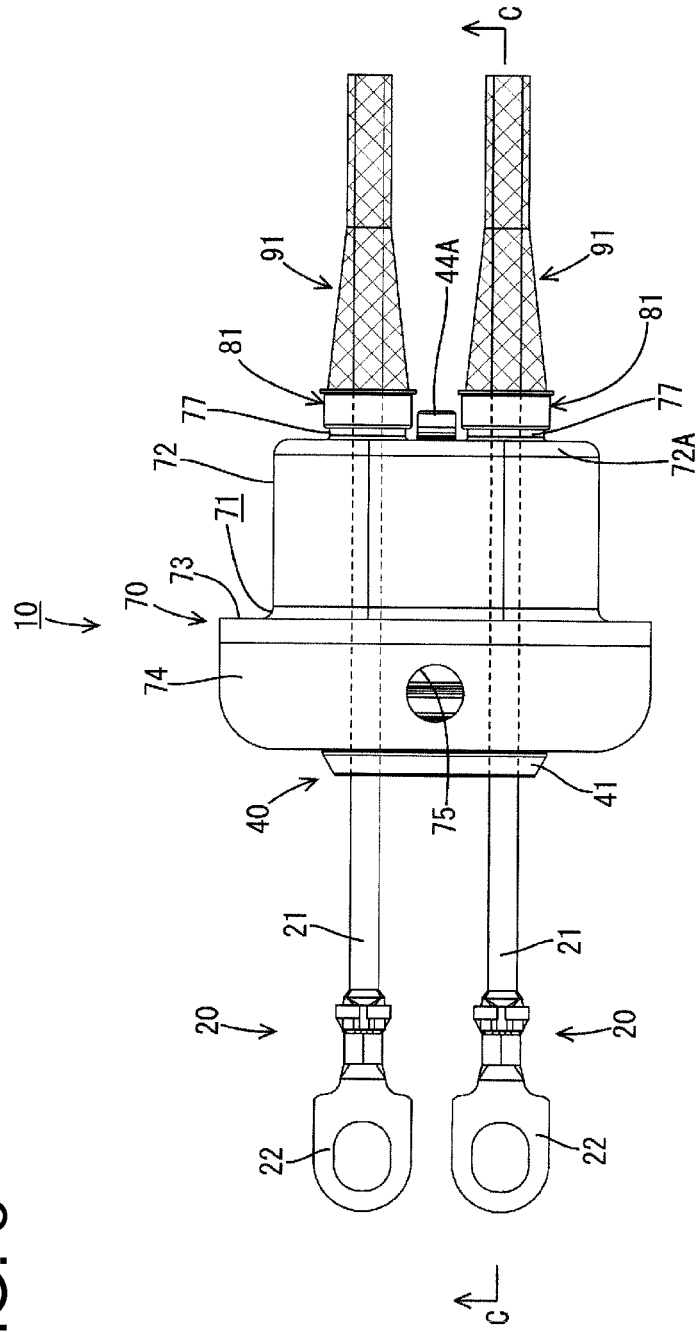
FIG. 8 is a plan view of a shield connector of an individual-core shield type.
Figure 9:
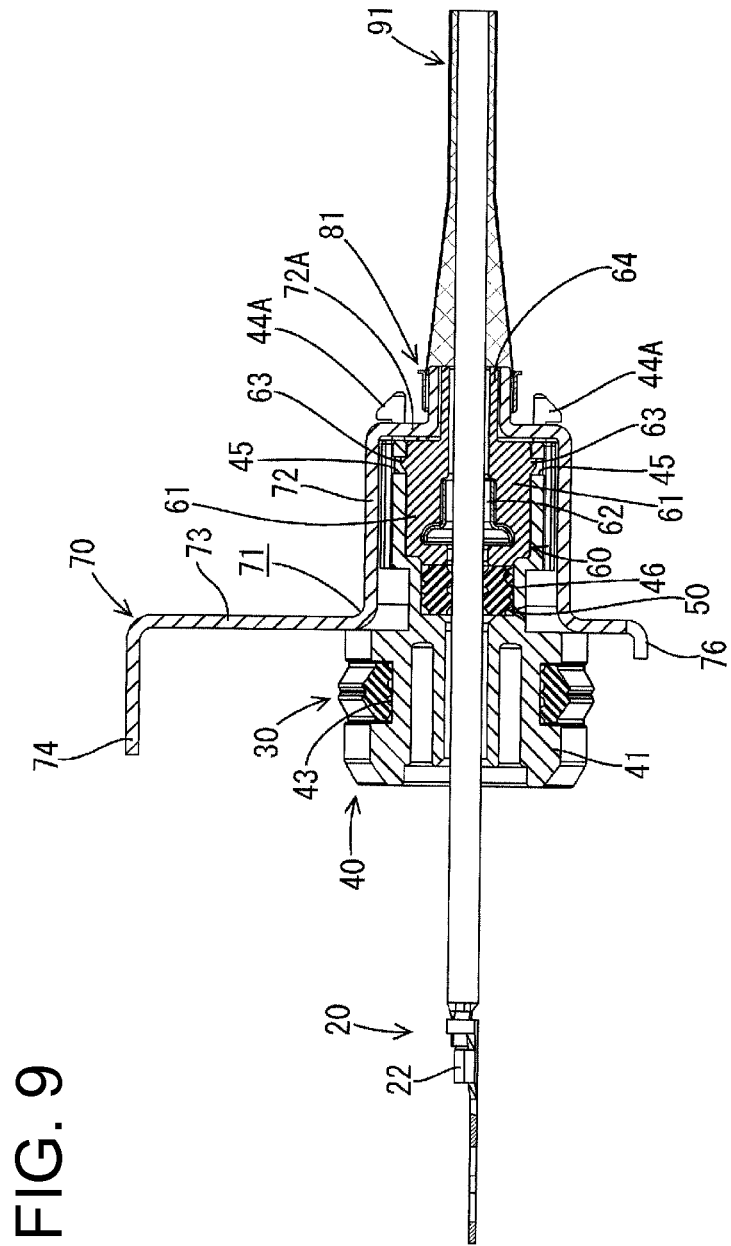
FIG. 9 is a section along C-C of FIG. 8.

Although a case where the device-side shield connecting portion to be connected to the shield shell 70 via the braided wire 90 is of the collective shield type has been described thus far, device-side shield connecting portions and the shield shell 70 can be connected to each other by using small-size braided wires 91 for the individual-core shield connecting portions 77 if the device-side shield connecting portions are of the individual-core shield type. Specifically, as shown in FIGS. 8 and 9, the small-size braided wires 91 are mounted on the outer peripheries of the individual-core shield connecting portions 77 and small-size caulking rings 81 are caulked on the outer peripheral surfaces of the individual-core shield connecting portions 77, whereby the small-size braided wires 91 are shield-connected to the outer peripheral surfaces of the individual-core shield connecting portions 77. By doing so, both the collective shield type and the individual-core shield type can be dealt with by the common housing 40 and the common shield shell 70, which leads to a reduction in the number of components. In other words, since only the caulking ring 80 and the small-size caulking rings 81 are dedicated components, cost such as mold cost can be drastically reduced.

This embodiment is configured as described above. Next, functions thereof are described. First, the procedure of assembling the shield connector 10 is briefly described. In starting this assembling, the wires 21 are inserted through the rubber ring 30, the housing 40, the respective rubber plugs 50, 50 and the respective caulking members 62, 62 in advance. By caulking and fixing the respective caulking members 62, 62 to the wires 21, 21 and assembling the respective half bodies 61, 61 with each other to sandwich these caulking members 62, 62 from upper and lower sides, the wire holder 60 is completed.

Subsequently, the respective rubber plugs 50, 50 are inserted into the rubber plug accommodating portions 46, 46 from behind the housing 40 and the wire holder 60 is inserted into the wire holder accommodating portion 42. Then, the respective retaining projections 63, 63 are fitted into the retaining holes 45, 45 to be locked, whereby the wire holder 60 is held in the wire holder accommodating portion 42. In parallel with this, the rubber ring 30 is mounted into the mounting groove 43.

When the shield shell 70 is assembled with the housing 40 from behind, the wire holder accommodating portion 42 is accommodated into the collective shield connecting portion 72 and the respective retaining pieces 44, 44 are inserted into the locking holes 78, 78. When the shield shell 70 reaches a proper assemble position, the respective retaining projections 44A, 44A are fitted into the locking holes 78, 78 to be locked. In this way, the housing 40 is held onto the shield shell 70.

Here, depending on the connection method of the device-side shield connecting portion(s), either one of the collective shield type and the individual-core shield type is selected. First, if the device-side shield connecting portion is of the collective shield type, the collective shield connecting portion 72 of the shield shell 70 is selected. Specifically, the braided wire 90 is connected to the collective shield connecting portion 72 by caulking the caulking ring 80 with the braided wire 90 mounted on the collective shield connecting portion 72. On the other hand, if the device-side shield connecting portions are of the individual-core shield type, the individual-core shield connecting portions 77 of the shield shell 70 are selected. Specifically, the small-size braided wires 91 are connected to the individual-core shield connecting portions 77 by caulking the small-size caulking rings 81 with the small-size braided wires 91 mounted on the individual-core shield connecting portions 77.

Thereafter, the fitting portion 41 of the housing 40 is fitted into the mounting hole of the case and a bolt is inserted into the fixing hole 75 of the case connecting portion 74 and tightened into the case, whereby the shield connector 10 is mounted and connected to the case and the shield shell 70 is shield-connected to the case.

As described above, in this embodiment, both the collective shield type and the individual-core shield type can be dealt with by one type of the shield shell 70 since the shield shell 70 is provided with both the collective shield connecting portion 72 and the individual-core shield connecting portions 77. Further, not only the shield shell 70, but also the housing 40 can deal with both the collective shield type and the individual-core shield type. This can lead to a reduction in the number of components and a drastic reduction in cost such as mold cost. Since the interval between the respective wires 21, 21 is made equal at the opposite front and rear sides of the shield connector 10, a section for adjusting the interval between the wires 21, 21 needs not be provided in the shield connector 10 and the length of the shield connector 10 needs not be extended in the front-back direction.

Further, since the individual-core shield connecting portions 77 are covered by the braided wire 90 after the wires 21 are pulled out backward from the individual-core shield connecting portions 77, the individual-core shield connecting portions 77 need not be individually closed even in the case of the collective shield type. Further, since the individual-core shield connecting portions 77 are provided on the back wall 72A of the collective shield connecting portion 72, these connecting portions 77 can be formed by drawing. In addition to these, since the caulking ring 80 and the small-size caulking rings 81 are caulked and connected to the braided wire 90 and the small-size braided wires 91, easier connection than the one by welding or the like can be realized.

The present invention is not limited to the above described and illustrated embodiment. For example, the following embodiments are also included in the technical scope of the present invention.

(1) Although the pair of individual-core shield connecting portions 77 are provided in the above embodiment, three or more individual-core shield connecting portions may be provided according to the present invention.

(2) Although the individual-core shield connecting portions 77 are provided on the back 72A of the collective shield connecting portion 72 in the above embodiment, the individual-core shield connecting portions may be provided on the flange portion 73 or may be provided on the outer peripheral surface of the collective shield connecting portion 72 according to the present invention.

(3) Although the individual-core shield connecting portions 77 serve as draw-out openings for the wires 21 in the above embodiment, the draw-out openings for the wires 21 may be provided separately from the individual-core shield connecting portions 77 in the case of the collective shield type.

(4) Although shield connection is realized by the caulking ring 80 and the small-size caulking rings 81 in the above embodiment, it may be realized by welding or the like according to the present invention.

The invention claimed is:

1. A shield shell to be connected to a case made of metal, comprising:

a shell main body including a case connecting portion to be connected to the case;

a single collective shield connecting portion provided on the shell main body and formed into a tubular shape having an open front end, a rear wall opposite the open front end, the rear wall having opposite front and rear surfaces, and a side wall extending between the front end and the rear wall and having a continuous first outer peripheral surface;

a plurality of individual-core shield connecting portions projecting from the rear surface of the rear wall and formed into a tubular shape, each of the plurality of individual-core shield connection portions having a second outer peripheral surface;

a first braided wire configured to be selectively mounted to the continuous first outer peripheral surface;

a first caulking ring configured to be caulked to an outer periphery of the first braided wire when the first braided wire is selectively mounted to the first outer peripheral surface to shield connect the first braided wire to the single collective shield connecting portion;

a plurality of second braided wires configured to be selectively mounted to each of the second outer peripheral surfaces of the plurality of individual-core shield connecting portions; and a plurality of second caulking rings configured to be mounted to each of the plurality of second braided wires when the second braided wires are selectively mounted to the second outer peripheral surfaces of the plurality to shield connect the plurality of second braided wires to the plurality of individual-core shield connecting portions.

2. A shield shell according to claim 1, wherein a plurality of wires are pulled out from the plurality of individual-core shield connecting portions to the outside of the shell main body.

3. A shield shell according to claim 1, wherein the collective shield connecting portion is formed to project backward from a front wall portion continuous with the case connecting portion on the shell main body.

4. A shield shell according to claim 3, wherein the plurality of individual-core shield connecting portions are provided on a rear wall portion arranged at a side of the shell main body opposite to the front wall portion.

5. A shield connector, comprising:
   a shield shell according to claim 1;
   a housing to be held onto the shield shell; and
   wires with terminal fittings inserted through the interior of the housing.

\* \* \* \* \*